US 8,780,642 B2

(12) United States Patent
Widjaja et al.

(10) Patent No.: US 8,780,642 B2
(45) Date of Patent: Jul. 15, 2014

(54) SPLIT GATE NAND FLASH MEMORY STRUCTURE AND ARRAY, METHOD OF PROGRAMMING, ERASING AND READING THEREOF, AND METHOD OF MANUFACTURING

(75) Inventors: Yuniarto Widjaja, San Jose, CA (US); John W. Cooksey, Brentwood, CA (US); Changyuan Chen, Sunnyvale, CA (US); Feng Gao, Sunnyvale, CA (US); Ya-Fen Lin, Santa Clara, CA (US); Dana Lee, Santa Clara, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 202 days.

(21) Appl. No.: 12/872,351

(22) Filed: Aug. 31, 2010

(65) Prior Publication Data

US 2010/0322015 A1 Dec. 23, 2010

Related U.S. Application Data

(62) Division of application No. 11/810,714, filed on Jun. 6, 2007, now Pat. No. 7,808,839, which is a division of application No. 11/134,540, filed on May 20, 2005, now Pat. No. 7,242,051.

(51) Int. Cl.
*G11C 11/34* (2006.01)
*G11C 16/04* (2006.01)

(52) U.S. Cl.
USPC ............ 365/185.29; 365/185.18; 365/185.05

(58) Field of Classification Search
USPC ....................... 365/185.01–185.33
See application file for complete search history.

(56) References Cited

U.S. PATENT DOCUMENTS

| 5,029,130 A | 7/1991 | Yeh |
| 5,412,600 A * | 5/1995 | Nakajima ................ 365/185.17 |

(Continued)

FOREIGN PATENT DOCUMENTS

| JP | 63-266885 | 2/1988 |
| JP | 63-266886 | 2/1988 |

(Continued)

OTHER PUBLICATIONS

C.Y. Shu et al., "Split-Gate NAND Flash Memory At 120 nm Technology Node Featuring Fast Programming and Erase," 2004 Symposium, VLSI Technology Digest of Technical Papers, pp. 78-79.

(Continued)

*Primary Examiner* — Kretelia Graham
(74) *Attorney, Agent, or Firm* — DLA Piper LLP (US)

(57) ABSTRACT

A split gate NAND flash memory structure is formed on a semiconductor substrate of a first conductivity type. The NAND structure comprises a first region of a second conductivity type in the substrate with a second region of the second conductivity type in the substrate, spaced apart from the first region. A continuous first channel region is defined between the first region and the second region. A plurality of floating gates are spaced apart from one another with each positioned over a separate portion of the channel region. A plurality of control gates are provided with each associated with and adjacent to a floating gate. Each control gate has two portions: a first portion over a portion of the channel region and a second portion over the associated floating gate and capacitively coupled thereto.

2 Claims, 10 Drawing Sheets

(56) References Cited

U.S. PATENT DOCUMENTS

| | | |
|---|---|---|
| 5,949,101 A | 9/1999 | Aritome |
| 5,982,662 A * | 11/1999 | Kobayashi et al. ...... 365/185.03 |
| 6,151,248 A | 11/2000 | Harari et al. |
| 6,272,050 B1 | 8/2001 | Cunnuingham et al. |
| 6,434,043 B2 | 8/2002 | Masuoka |
| 6,825,084 B2 | 11/2004 | Ogura et al. |
| 6,902,975 B2 * | 6/2005 | Tu ................................ 438/257 |
| 6,911,690 B2 * | 6/2005 | Hsu et al. ...................... 257/315 |
| 6,992,929 B2 | 1/2006 | Chen et al. |
| 7,057,230 B2 * | 6/2006 | Tanaka et al. ................. 257/315 |
| 7,205,194 B2 | 4/2007 | Lee et al. |
| 7,247,907 B2 | 7/2007 | Gao et al. |
| 7,544,569 B2 | 6/2009 | Gao et al. |
| 2001/0012217 A1 | 9/2001 | Masuoka |
| 2003/0043633 A1 * | 3/2003 | Forbes et al. ............ 365/185.28 |
| 2004/0061167 A1 | 4/2004 | Mantha |
| 2004/0125653 A1 | 7/2004 | Tran et al. |
| 2004/0232473 A1 | 11/2004 | Hsu et al. |
| 2005/0099849 A1 | 5/2005 | Lutze |
| 2008/0175053 A1 * | 7/2008 | Lue et al. ................. 365/185.05 |

FOREIGN PATENT DOCUMENTS

| | | |
|---|---|---|
| JP | 2003-347439 | 5/2003 |
| KR | 10-0221940 | 9/1999 |
| KR | 10-2005-0029423 | 3/2005 |

OTHER PUBLICATIONS

Japanese Notification of Reason for Rejection for JP 2006-129291, in Japanese; dated May 28, 2012.

Japanese Notification of Reason for Rejection for JP 2006-129291, Translation; dated May 28, 2012.

Notice of Preliminary Rejection dated Sep. 7, 2012 in connection with the related Korean Patent Application No. 10-2006-0045268. (English and Korean translations).

* cited by examiner

US 8,780,642 B2

SPLIT GATE NAND FLASH MEMORY STRUCTURE AND ARRAY, METHOD OF PROGRAMMING, ERASING AND READING THEREOF, AND METHOD OF MANUFACTURING

CROSS-REFERENCE TO RELATED APPLICATIONS

This is a divisional of application Ser. No. 11/810,714, filed Jun. 6, 2007, which is a divisional of Ser. No. 11/134,540, filed May 20, 2005, which are incorporated herein by reference in its entirety.

TECHNICAL FIELD

The present invention relates to a split gate NAND flash memory structure and more particularly to a split gate NAND flash memory structure having only a source and drain at the ends of the NAND flash memory structure.

BACKGROUND OF THE INVENTION

Non-volatile memory integrated circuit chips are well known in the art. See for example U.S. Pat. Nos. 5,029,130 and 6,151,248. One form of a non-volatile memory integrated circuit chip is a "NAND" flash memory device in which a string of serially connected non-volatile memory cells are grouped in a NAND flash memory structure.

Referring to FIG. 1A there is shown a cross-sectional view of a prior art split gate NAND flash memory structure 10. (See "Split-Gate NAND Flash Memory At 120 nm Technology Node Featuring Fast Programming and Erase" by C. Y. Shu et al, 2004 symposium on VLSI Technology Digest of Technical Papers, p. 78-79). The NAND flash memory structure 10 is formed on a semiconductor substrate 12 of a first conductivity type. The NAND flash memory structure 10 has a first region 14 of a second conductivity type and a second region 16 of the second conductivity type in the substrate 12. The first region 14 and the second region 16 are spaced apart from one another to define a continuous channel region between the first region 14 and the second region 16. A plurality of floating gates (18A ... 18N) are spaced apart from one another with each floating gate 18 positioned over a separate portion of the channel region and separated and insulated therefrom. The structure 10 further has a select gate 20 associated with each floating gate 18. The select gate 20 is positioned over another portion of the channel region, and is immediately adjacent to the associated floating gate 18 and is insulated therefrom. Finally, the structure 10 has a plurality of control gates 22 with each control gate 22 associated with a floating gate 18 and forming a stacked gate configuration with the associated floating gate 18.

Typically, the NAND gate structure 10 is formed in a column direction with the select gate 20 and the control gate 22 connecting the respective select gates and control gates in a row direction. A plan view of an array of such NAND structures 10 is shown in FIG. 1B.

The problem with the NAND structure 10 of the prior art is that it requires two row lines for each cell: one for the select gate 20 and one for the control gate 22. With two lines for each cell and where for non-volatile memory cells the lines must carry high voltages, there would be too many high voltage control lines required for the pitch of each cell.

Accordingly, there is a need to reduce the line count per cell to thereby improve the pitch of the nonvolatile memory device.

SUMMARY OF THE INVENTION

Accordingly, in the present invention, a NAND flash memory structure is formed on a semiconductor substrate of a first conductivity type. The structure has a first region of a second conductivity type in the substrate. A second region of the second conductivity type is in the substrate, spaced apart from the first region, thereby defining a continuous channel region there between. A plurality of floating gates are spaced apart from one another with each floating gate positioned over a separate portion of the channel region and insulated therefrom. Finally, a plurality of control gates is provided, with each control gate associated with and adjacent to a floating gate. Each control gate has two portions: a first portion over a portion of the channel region, and a second portion over the associated floating gate and is capacitively coupled thereto.

DETAILED DESCRIPTION OF THE INVENTION

Figure 1A:
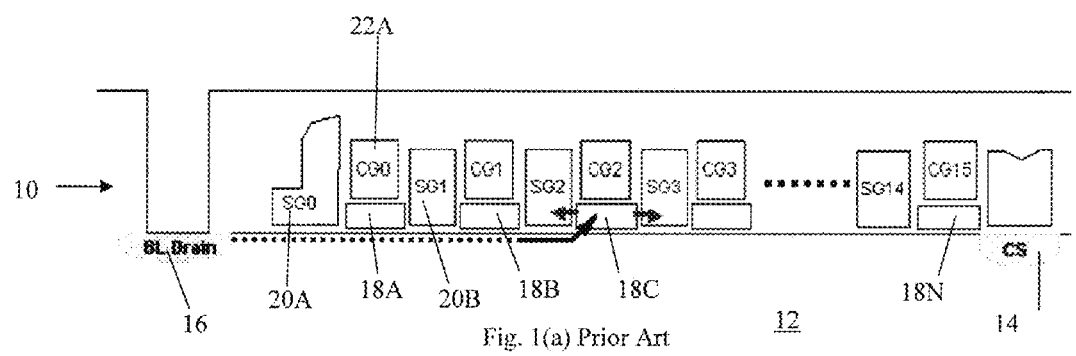
FIG. 1A is a schematic cross-sectional view of a NAND flash memory structure of the prior art.
Figure 1B:
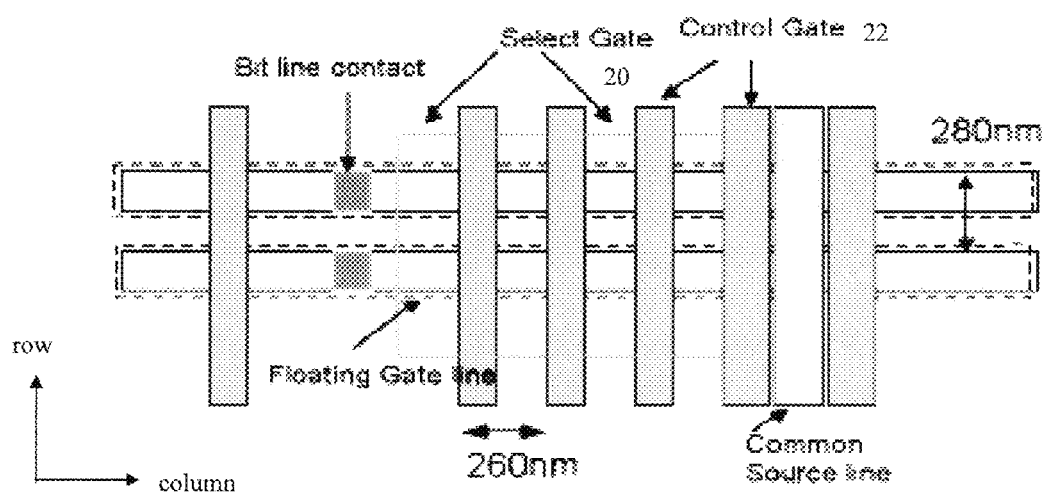
FIG. 1B is a top view of a NAND flash memory device using a plurality of NAND flash memory structures of the prior art shown in FIG. 1A showing the interconnection of one NAND flash memory structure to an adjacent NAND flash memory structure.
Figure 2:
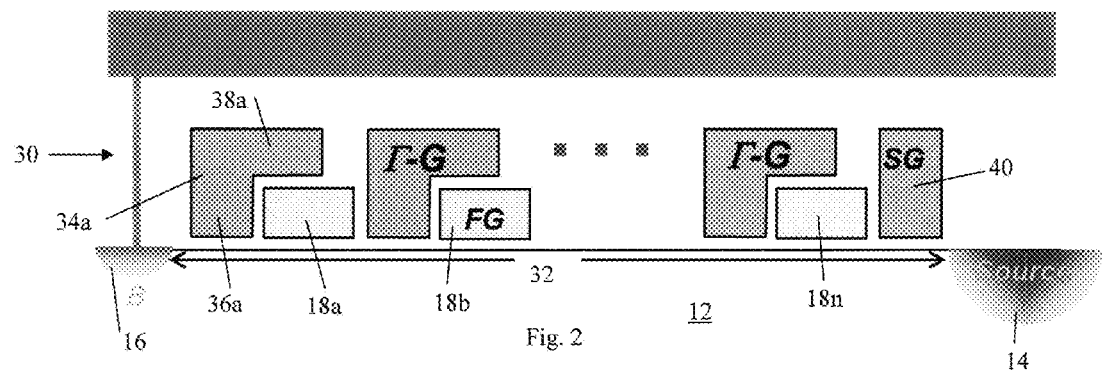
FIG. 2 is a schematic cross-sectional view of one embodiment of a NAND flash memory structure of the present invention.

Referring to FIG. 2 there is shown a cross-sectional view of a first embodiment 30 of a NAND flash memory structure of the present invention. The NAND flash memory structure 30 shown in FIG. 2 is formed on a semiconductor substrate 12 of a first conductivity type, such as P-type. The structure 30 has a first region 14 of a second conductivity type, such as N type, as a source, in the substrate 12. Spaced apart from the first region 14 or the source 14 is a second region 16, such as a drain, also of the second conductivity type, in the substrate 12. The source region 14 is characterized by being a deeper implant than the drain region 16. The first region 14 and the second region 16 are spaced apart from one another to define a continuous channel region 32 there between. A plurality of floating gates 18 are spaced apart from one another and are positioned above the channel region 32 and is insulated therefrom. Each floating gate 18 is positioned over a separate portion of the channel region 32 and controls the conduction of the current in the channel region portion over which the floating gate 18 is positioned. The NAND flash memory structure 30 also comprises a plurality of controls gates 34. Each control gate 34 is associated with and is adjacent to a floating gate 18. Each control gate 34 has two portions: a first portion 36 which is over a portion of the channel region adjacent to the associated floating gate 18 and a second portion 38 over the associated floating gate 18 and insulated therefrom and is capacitively coupled to the floating gate 18. The control gate 34 can be a unitary structure as shown in FIG. 2 or the two portions 36 and 38 can be separate portions but electrically connected ex situ, i.e. electrically outside of the NAND flash memory structure 30. Each of the first portion 36 and second portion 38 can be substantially rectilinearly shaped. In the embodiment shown in FIG. 2, the NAND flash memory structure 30 also comprises a first select gate 40 positioned over a portion of the channel region 32 and insulated therefrom and is immediately adjacent to the source region 14. The select gate 40 functions as a gate of a conventional MOS transistor. The NAND structure 30 can also comprise a second select gate (not shown) positioned over a portion of the channel region 32 which is immediately adjacent to the second region 16 or the drain region. However, in the embodiment shown in FIG. 2, the first portion 36A of the control gate 34A is positioned over a portion of the channel region 32 which is immediately adjacent to the drain region 16.

Figure 3:
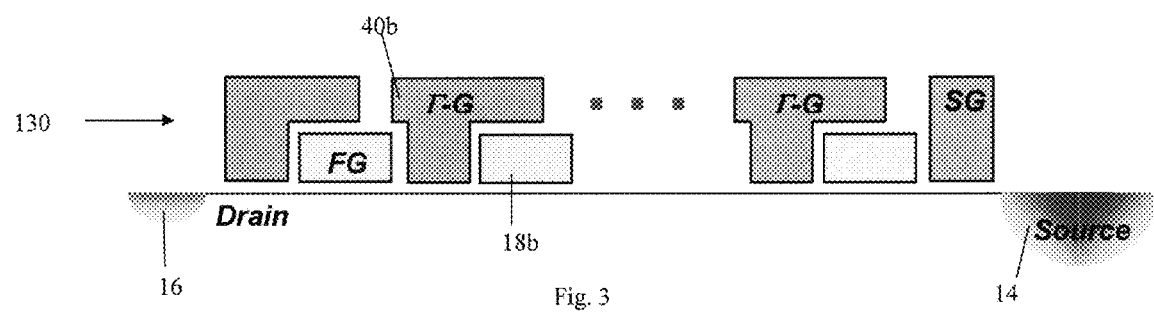
FIG. 3 is a schematic cross-sectional view of another embodiment of a NAND flash memory structure of the present invention.

Referring to FIG. 3 there is shown a cross-sectional view of a second embodiment of a NAND flash memory structure 130 of the present invention. Similar to the embodiment of the NAND flash memory structure 30 shown in FIG. 2, the structure 130 comprises a semiconductor substrate 12 of a first conductivity type, such as P-type. The structure 30 has a first region 14 of a second conductivity type, such as N type, as a source, in the substrate 12. Spaced apart from the first region 14 or the source 14 is a second region 16, such as a drain, also of the second conductivity type, in the substrate 12. The source region 14 is characterized by being a deeper implant than the drain region 16. The first region 14 and the second region 16 are spaced apart from one another to define a continuous channel region 32 there between. A plurality of floating gates 18 are spaced apart from one another and are positioned above the channel region 32 and is insulated therefrom. Each floating gate 18 is positioned over a separate portion of the channel region 32 and controls the conduction of the current in the channel region portion over which the floating gate 18 is positioned. The NAND flash memory structure 30 also comprises a plurality of controls gates 34. Each control gate 34 is associated with and is adjacent to a floating gate 18. Each control gate 34 has two portions: a first portion 36 which is over a portion of the channel region adjacent to the associated floating gate 18 and a second portion 38 over the associated floating gate 18 and insulated therefrom and is capacitively coupled to the floating gate 18. The control gate 34 can be a unitary structure as shown in FIG. 2 or the two portions 36 and 38 can be separate portions but electrically connected ex situ, i.e. electrically outside of the NAND flash memory structure 30. Each of the first portion 36 and second portion 38 can be substantially rectilinearly shaped.

Each control gate 34 further has a third portion 39 which is a tab portion. The tab portion 39 extends in a direction away from the second portion 38 which is positioned over the associated floating gate 18 and is capacitively coupled thereto. The tab portion 39 extends in a direction towards the neighboring floating gate 18 to which the control gate 34 is not associated. In the embodiment shown in FIG. 3, the NAND flash memory structure 30 also comprises a first select gate 40 positioned over a portion of the channel region 32 and insulated therefrom and is immediately adjacent to the source region 14. The select gate 40 functions as a gate of a conventional MOS transistor. The NAND structure 30 can also comprise a second select gate (not shown) positioned over a portion of the channel region 32 which is immediately adjacent to the second region 16 or the drain region. However, in the embodiment shown in FIG. 3, the first portion 36A of the control gate 34A is positioned over a portion of the channel region 32 which is immediately adjacent to the drain region 16.

Figure 4:
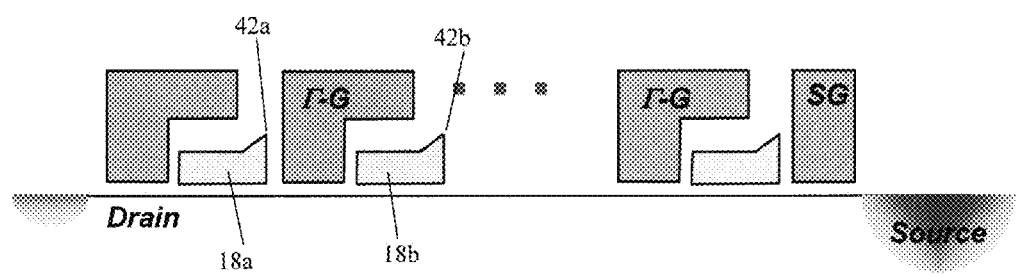
FIG. 4 is a schematic cross-sectional view of yet another embodiment of a NAND flash memory structure of the present invention.

Referring to FIG. 4 there is shown a third embodiment of a NAND flash memory structure 230 of the present invention. The structure 230 is similar to the structure 30 shown in FIG. 2. The structure 230 comprises a semiconductor substrate 12 of a first conductivity type, such as P-type. The structure 30 has a first region 14 of a second conductivity type, such as N type, as a source, in the substrate 12. Spaced apart from the first region 14 or the source 14 is a second region 16, such as a drain, also of the second conductivity type, in the substrate 12. The source region 14 is characterized by being a deeper implant than the drain region 16. The first region 14 and the second region 16 are spaced apart from one another to define a continuous channel region 32 there between. A plurality of floating gates 18 are spaced apart from one another and are positioned above the channel region 32 and is insulated therefrom. Each floating gate 18 is positioned over a separate portion of the channel region 32 and controls the conduction of the current in the channel region portion over which the floating gate 18 is positioned. The NAND flash memory structure 30 also comprises a plurality of controls gates 34. Each control gate 34 is associated with and is adjacent to a floating gate 18. Each control gate 34 has two portions: a first portion 36 which is over a portion of the channel region adjacent to the associated floating gate 18 and a second portion 38 over the associated floating gate 18 and insulated therefrom and is capacitively coupled to the floating gate 18. The control gate 34 can be a unitary structure as shown in FIG. 2 or the two portions 36 and 38 can be separate portions but electrically connected ex situ, i.e. electrically outside of the NAND flash memory structure 30. Each of the first portion 36 and second portion 38 can be substantially rectilinearly shaped.

In addition, each of the floating gates 18 in the structure 230 has a tip 42 which facilitates the tunneling of electrons from the floating gate 18 to an adjacent control gate 34 to which the floating gate 18 is not capacitively coupled. Thus, as shown in FIG. 4, the tip 42A of the floating gate 18A is on a side of the floating gate 18A closest to the control gate 34B. The control gate 34B may or may not have a tab portion 39B which is capacitively coupled to the floating gate 18A. Of course, it is also possible to the have the sharp tip or corner 42 of the floating gate 18 on a side directed to the control gate 34 to which the second portion 38 of the control gate 34 is capacitively coupled thereto. In that event, the electrons from the floating gate are directed to tunnel through the sharp tip 42 to the control gate 34 having the second portion 38 capacitively coupled to the floating gate 18.

In the embodiment shown in FIG. 4, the NAND flash memory structure 30 also comprises a first select gate 40 positioned over a portion of the channel region 32 and insulated therefrom and is immediately adjacent to the source region 14. The select gate 40 functions as a gate of a conventional MOS transistor. The NAND structure 30 can also comprise a second select gate (not shown) positioned over a portion of the channel region 32 which is immediately adjacent to the second region 16 or the drain region. However, in the embodiment shown in FIG. 4, the first portion 36A of the control gate 34A is positioned over a portion of the channel region 32 which is immediately adjacent to the drain region 16.

Figure 5A:
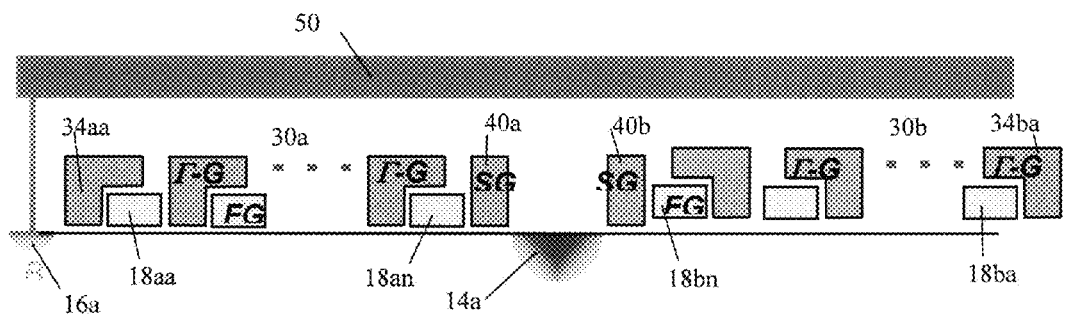
FIG. 5A is a schematic cross-sectional view of a plurality of NAND flash memory structures of the present invention interconnected.
Figure 5B:
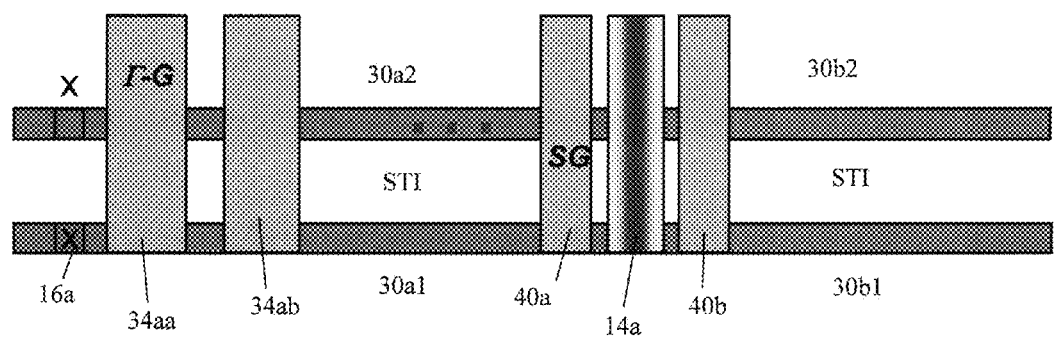
FIG. 5B is a top plan view of the NAND flash memory structures of the present invention shown in FIG. 5A.

Referring to FIG. 5A there is a cross-sectional view of two of the first embodiment NAND flash memory structures 30 connected together in an array. FIG. 5B is a top view of the interconnection of the NAND flash memory structures 30 in an array. As can be seen in FIG. 5B, the structures 30 are serially connected in the column direction. The structures 30 are separated from one another by a column of isolation, such as a shallow trench isolation (STI). Adjacent to a pair of interconnected structures 30A1 and 30B1 is yet another pair of interconnected structures 30A2 and 30B2 which is parallel to the interconnected pair of structures 30A1 and 30B1. As is familiar to those skilled in the art, the term row and column may be interchanged.

As can be seen in FIG. 5A, the serially connected structures 30A and 30B share a common first region 14, which extends in the row direction. Adjacent to the first region 14 to one side is a select gate 40A of the structure 30A. To the other side of the first region 14 is a select gate 40B of the structure 30B. Each of the structures 30A and 30B is as described above. A drain region 16A is associated with the structure 30A and a drain region 16B (not shown) is associated with the structure 30B. A bit line 50 is connected to the drain regions 16A and 16B in the column direction.

As can be seen in FIG. 5B, the control gate 34AA interconnects the control gate 34A of the structure 30A1 and the control gate 34A of the structure 30A2. The control gate 34AA extends in a row direction and interconnects the control gate of one active region and crosses over the STI to interconnect with the control gate of an adjacent active region. Thus, as can be seen from FIG. 5B, the advantage of the structure 30/130/230 of the present invention, is that only a single line is required to "string" or interconnect the structures for each cell from one active region to another. In this manner, the pitch of the cells can be more finely controlled.

Of course, each of the other embodiments of the structure 130 and 230 can be similarly interconnected into an array form, similar to the interconnection of the structures 30 as shown in FIGS. 5A and 5B. The use of either the structures 130 or 230 interconnected in the manner of the structure 30 will also result in the benefit of a single line per cell.

Figure 6A:
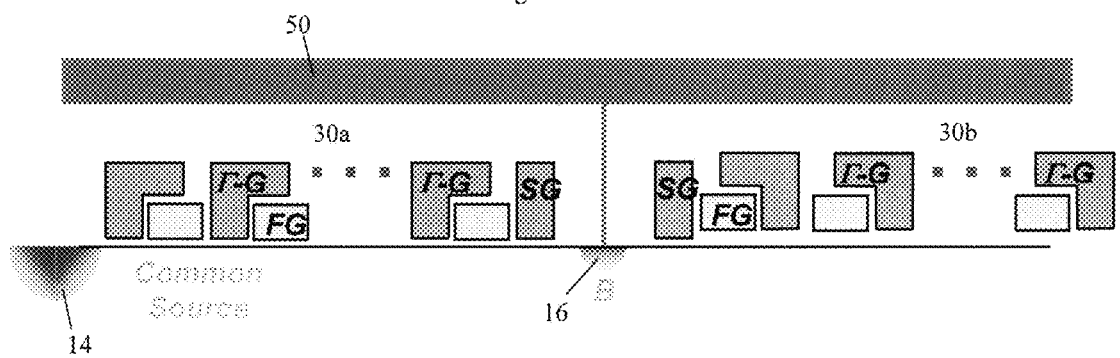
FIG. 6A is a cross-sectional view of another embodiment of a plurality of interconnected NAND flash memory structures of the present invention.
Figure 6B:
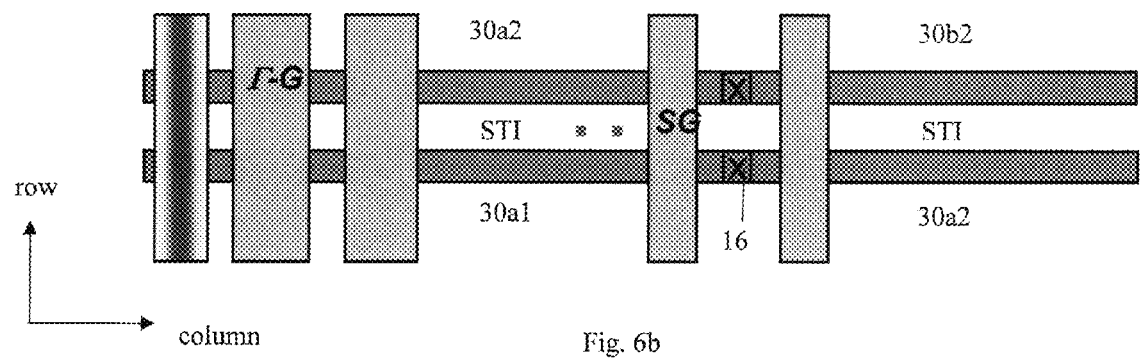
FIG. 6B is a top plan view of the NAND flash memory structures of the present invention shown in FIG. 6A.

Referring to FIGS. 6A and 6B there is shown yet another embodiment of the interconnection of the structures 30 into an array. The only difference between the array shown in FIGS. 6A and 6B and the array shown in FIGS. 5A and 5B is that the structures 30A and 30B are serially connected in the active region at the common drain 16 with an associated select gate immediately adjacent to each side of the commonly connected drain 16. In all other aspects, the array shown in FIGS. 6A and 6B is identical to the array shown in FIGS. 5A and 5B, with the same advantage discussed previously of having only a single control gate for each cell interconnecting the adjacent NAND structures across the STI.

Method of Manufacturing

Figures 1, 7A:
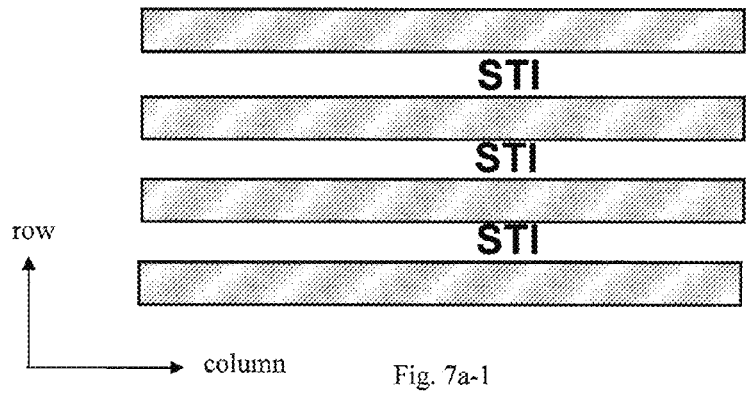
FIG. 7A-1 is a top view of the first steps in the manufacturing of one embodiment of the NAND flash memory structure of the present invention, with FIG. 7A-2 being a cross-sectional view through an active region.
Figures 2, 7A:
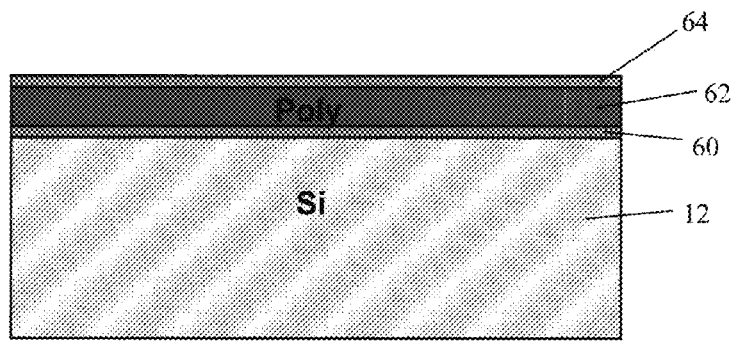

Referring to FIG. 7A-1 and 7A-2, there is shown the top view and side view (through the active region) respectively of the first steps in a method of making the array of NAND flash structures 30 of the present invention. In the first step, a semiconductor silicon substrate 12 has a first layer of silicon dioxide 60 applied to the top surface of the substrate 12. For a one hundred thirty (130) nanometer process, the thickness of the first layer of silicon dioxide 60 is on the order of ninety (90) angstroms. It should be noted that this thickness will vary depending upon the geometry of the process used and is not a limitation of the present invention. A layer of polysilicon 62 is then deposited on the first layer of silicon dioxide 60. The polysilicon 62 is on the order of five hundred (500) angstroms in thickness. Finally, a second layer of silicon dioxide 64 is deposited on the layer of polysilicon 62. After the first layer of silicon dioxide 60, polysilicon 62 and the second layer of silicon dioxide 64 are deposited, photoresist is applied and the structure is subject to a masking operation in which stripes of exposed regions in the photoresist in the column direction are etched through the second layer of silicon dioxide 64, the polysilicon 62, the first layer of silicon dioxide 60, and into the semiconductor substrate 12. As will be seen in subsequent discussion, the thickness of the second layer of silicon dioxide 64 is not critical. After the semiconductor substrate 12 has been etched forming the trench for the STI, silicon dioxide is used to fill the STI to a level above the second layer of silicon dioxide 64. The photoresist is then removed, and the silicon dioxide above the STI is polished using CMP until it is substantially co-planar with the top level of the second layer 64 of the silicon dioxide. The foregoing steps for forming the stripes of active regions parallel to one another but separated apart from one another by an STI is well-known in the art.

Figure 7B:
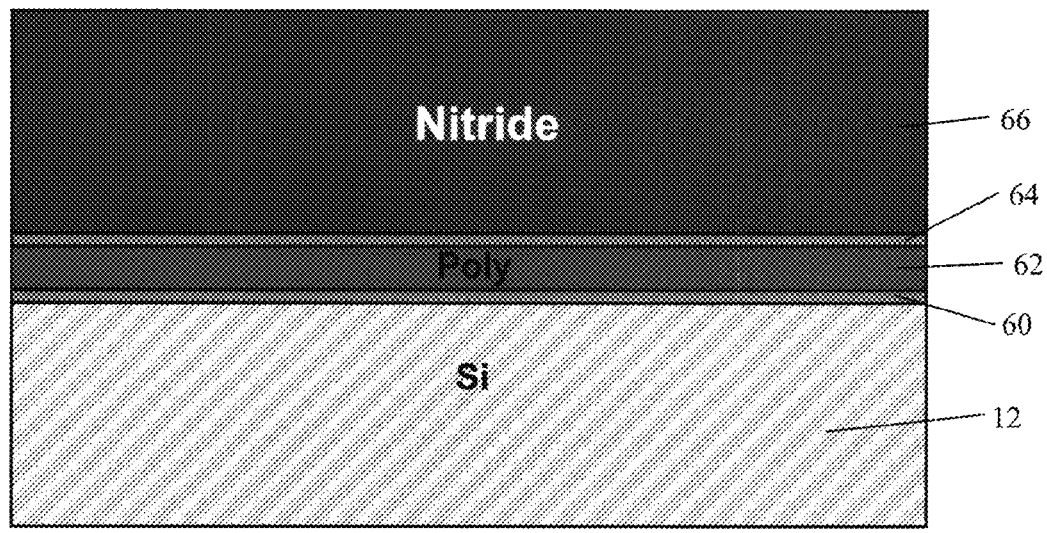
FIGS. 7B-7M are cross-sectional views through the active region of subsequent steps showing the method of making an embodiment of the NAND flash memory structure of the present invention.

Silicon nitride 66 is then deposited everywhere on the surface of the structure shown in FIG. 7A. The silicon nitride layer 66 is on the order of thirty five hundred (3500) angstroms thick. The resulting structure is shown in FIG. 7B. The silicon nitride 66 can be deposited by, for example, low pressure chemical vapor deposition (LPCVD).

Figure 7C:
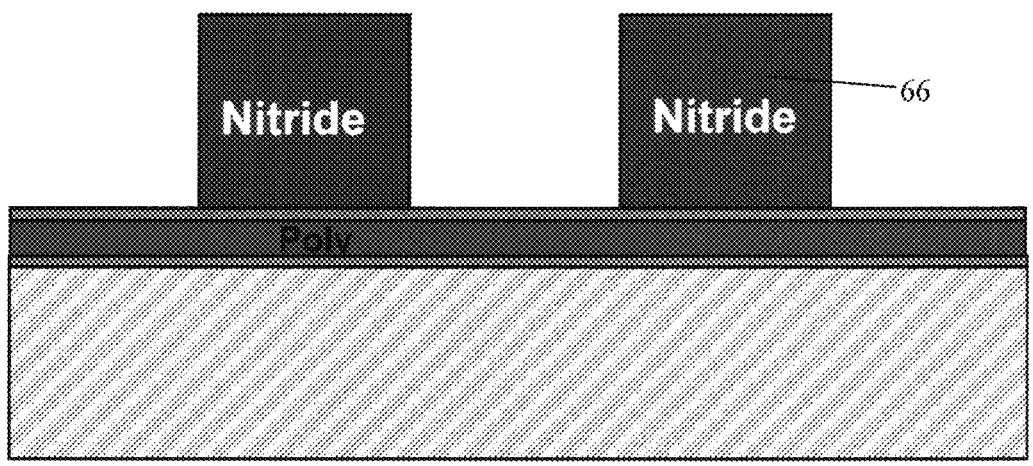

Photoresist is then applied to the silicon nitride layer 66 and it is exposed in a pattern in stripes in the row direction. The photoresist is then masked and is exposed. In the exposed region the stripes of silicon nitride 66 are etched anisotropically and removed. The etchant etches the silicon nitride 66 until the second layer of silicon dioxide 64 is reached. The resultant is shown in FIG. 7C. It should be noted that the structure shown in FIG. 7C comprises stripes of spaced apart silicon nitride 66 running substantially parallel to one another in the row direction.

Silicon dioxide 68 is then deposited by an HTO (high temperature oxide) process and is then anisotropically etched. The etching of the silicon dioxide proceeds until the polysilicon 64 is exposed and until oxide spacers 68 are formed along each of the side walls of the silicon nitride 66. The resultant structure is shown in FIG. 7D.

Figure 7D:
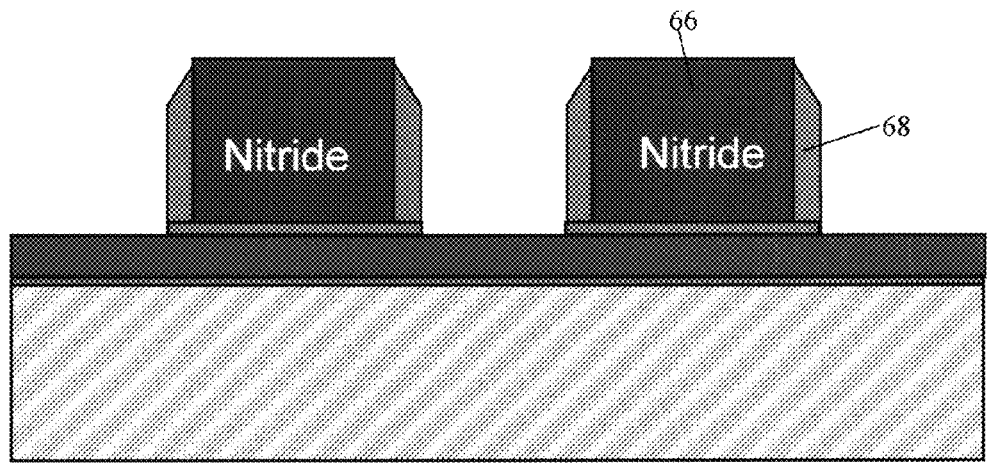
Figure 7E:
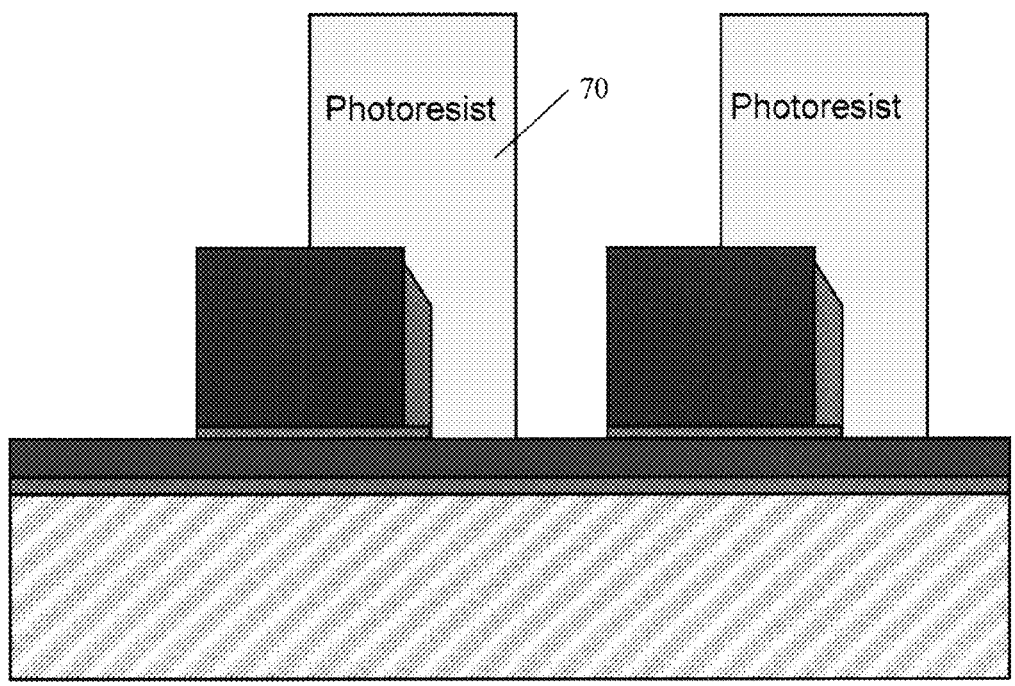

Photoresist 70 is then applied on the structure shown in FIG. 7D and is masked and portions of the photoresist 70 is removed. The photoresist 70 is exposed such that stripes of the photoresist 70 are removed exposing one side of the spacer 68 adjacent to each of the nitride stripes 66. The exposed oxide spacer 68 to one side of each of the silicon nitride stripes 66 is then etched leaving the structure shown in FIG. 7E.

Figure 7F:
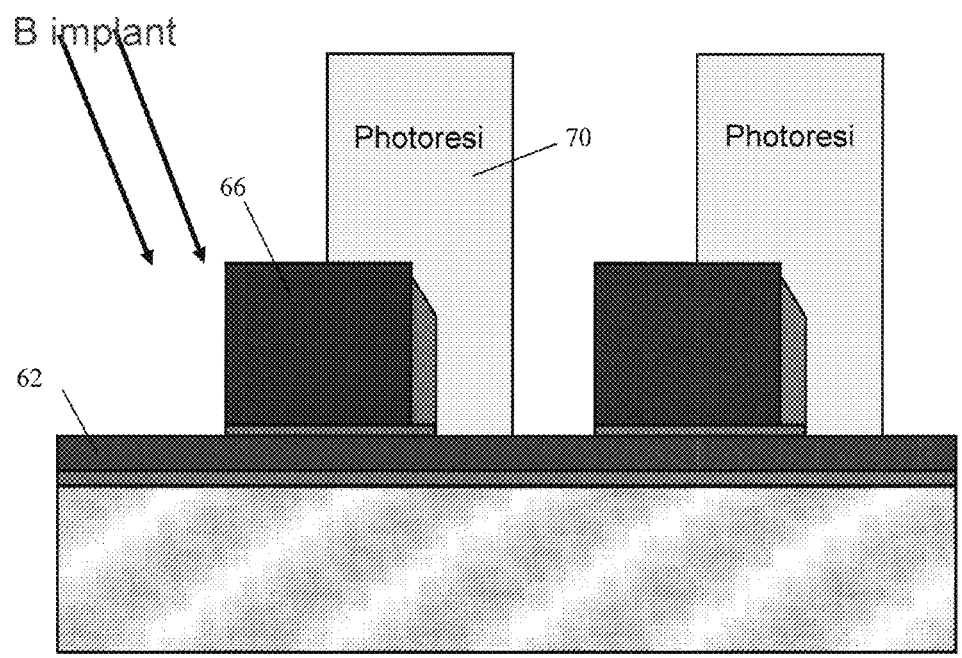

Angled Boron implant is then performed implanting into the polysilicon 64 which improves the hot carrier injection in the region of the substrate 12 which is substantially below the silicon nitride stripe 66. The silicon nitride 66 covers the region of the polysilicon 62 that would eventually form the floating gate. The resultant structure is shown in FIG. 7F.

Figure 7G:
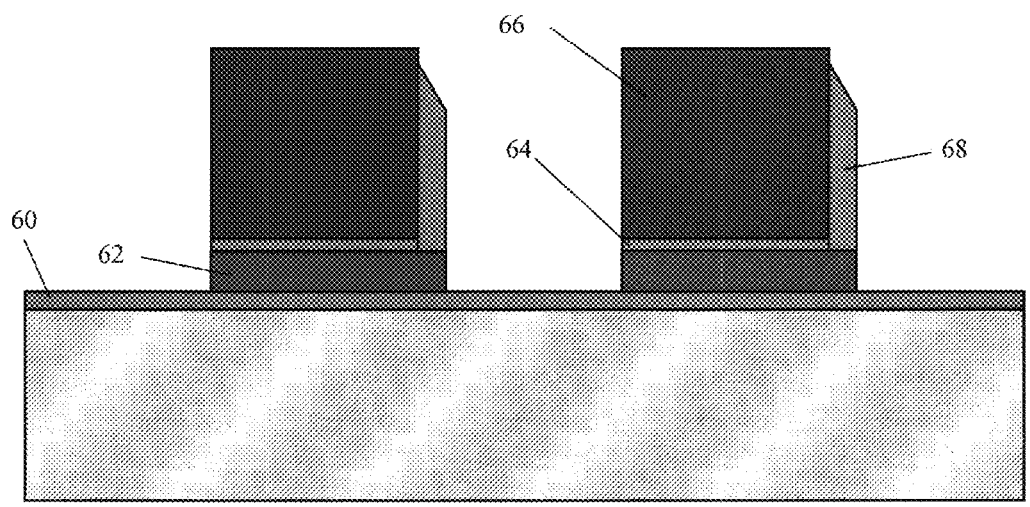

The photoresist 70 is then removed by suitable etching and using the silicon nitride 66 as the mask, the polysilicon 62 is then anisotropically etched until the first layer of silicon dioxide 60 is exposed. The resultant structure is shown in FIG. 7G.

Figure 7H:
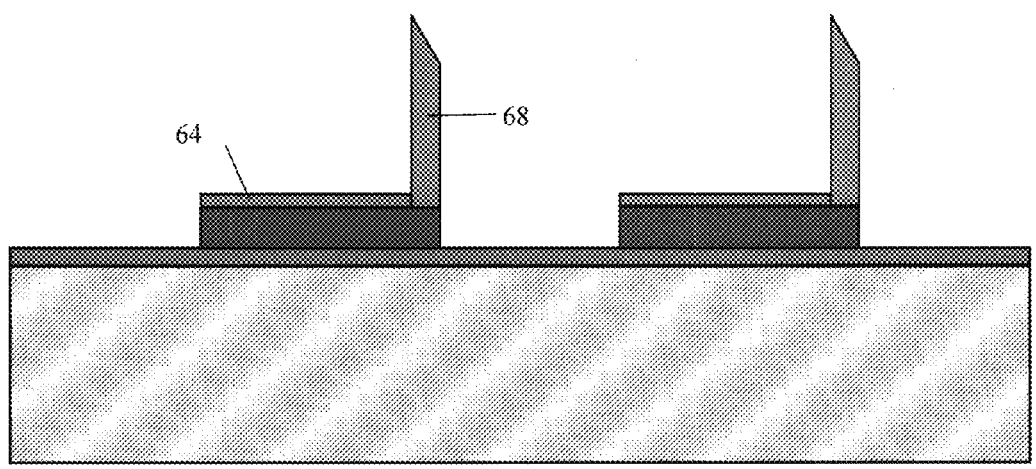

The silicon nitride 66 is then etched leaving the resultant structure shown in FIG. 7H.

The structure shown in FIG. 7H is then etched by a wet oxide etch process. This removes the first layer of silicon dioxide 60 which is not covered by the polysilicon 62 as well as the second layer of silicon dioxide 64 covering the polysilicon 62. The spacer 68 after etching is substantially a "post" in shape. It should be noted that the posts 68 extend in a row direction across each STI and active regions. The resultant structure is shown in FIG. 7I.

Figure 7I:
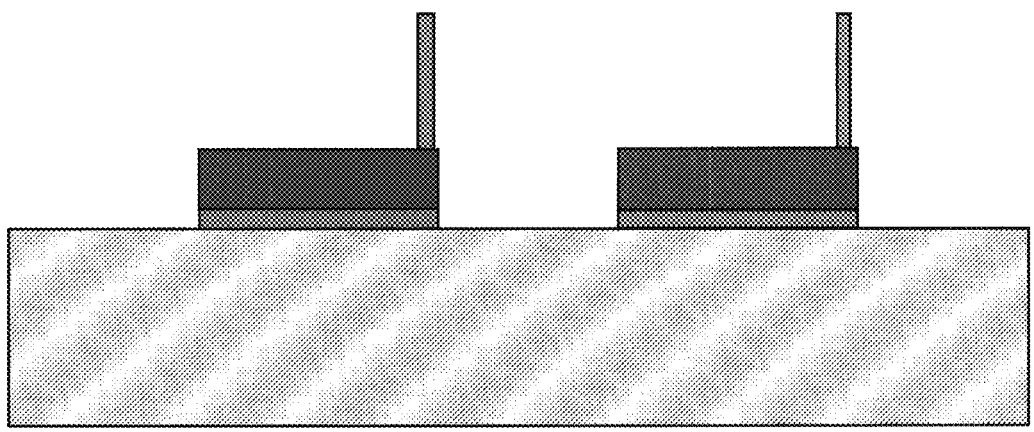
Figure 7J:
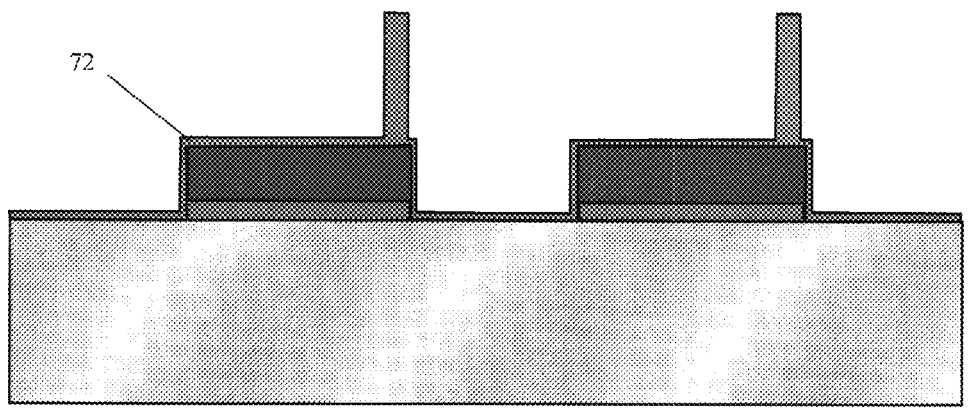

Silicon dioxide 72 is then deposited or thermally grown on the structure shown in FIG. 7I. The layer of silicon dioxide 72 is deposited or grown on the structure shown in FIG. 7I. The resultant structure is shown in FIG. 7J.

Polysilicon 74 is then deposited again everywhere. The resultant structure is show in FIG. 7K.

Figure 7K:
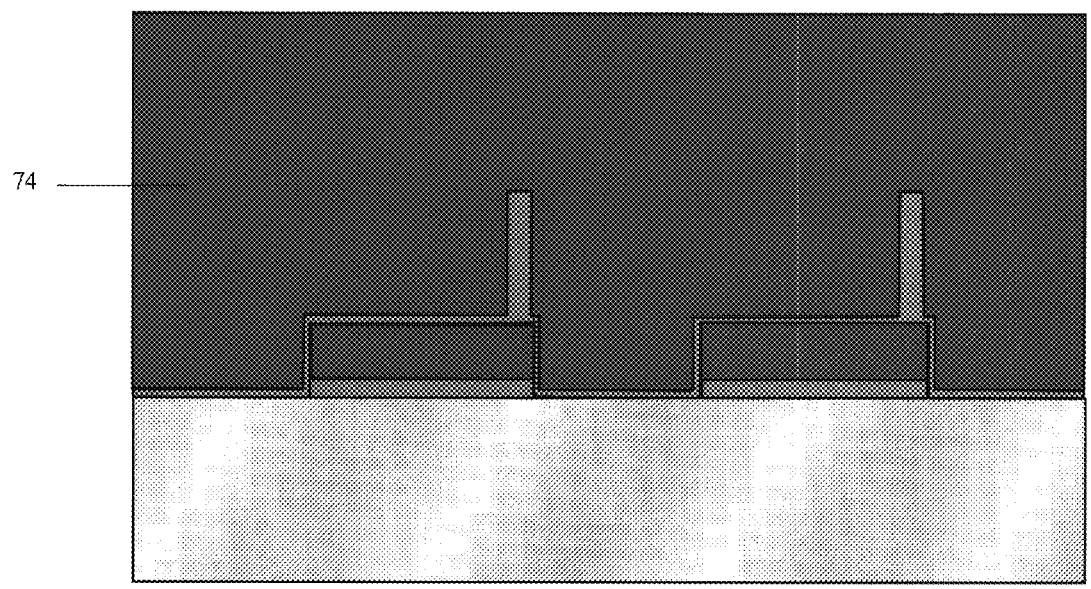

The structure shown in FIG. 7K is CMP etched or is subject to an etch back process until each of the post 68 is exposed. The top layer of the polysilicon 74 is then metalized to form salicide formation 76. This provides greater electrical conductivity. The resultant structure is shown in FIG. 7L.

Figure 7L:
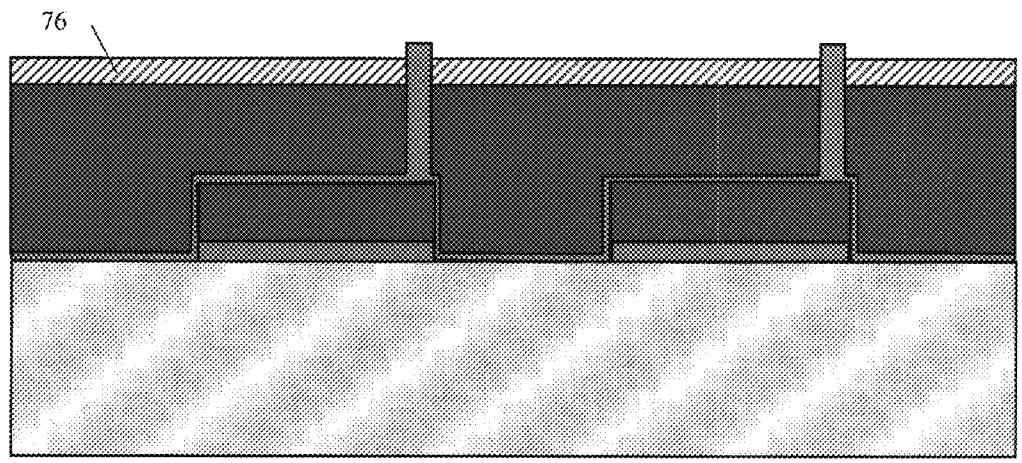
Figure 7M:
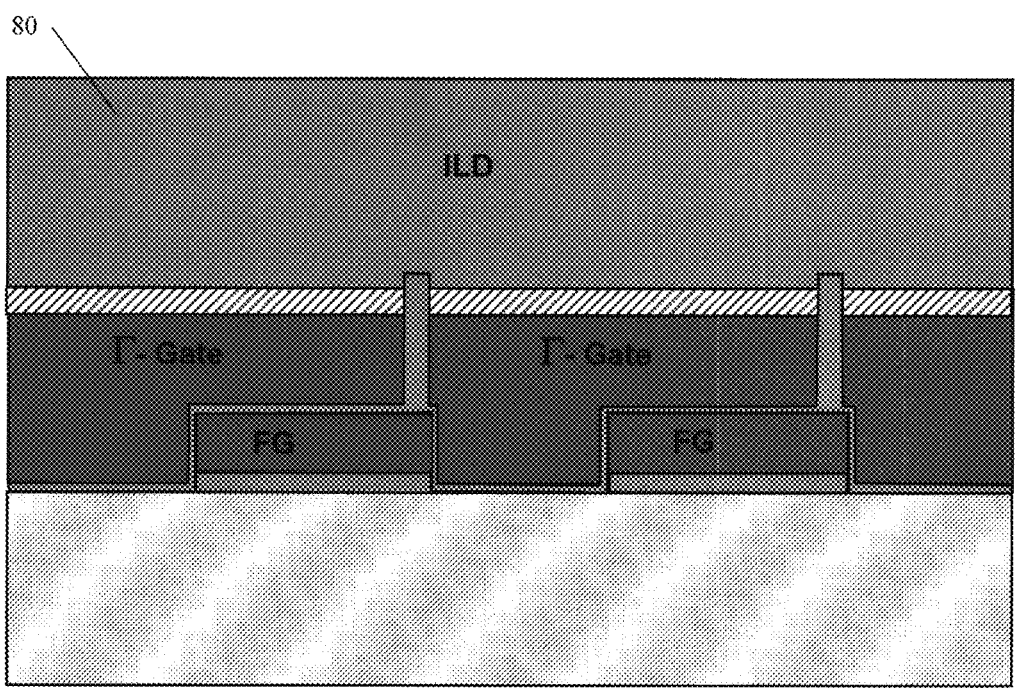

The structure shown in FIG. 7L is then deposited with a layer of interlayer deposited (ILD) oxide 80. The resultant structure is shown in FIG. 7N.

Methods of Operation

Erase Operation No. 1

In a first method of erasing a NAND flash memory structure 30/130/230 of the present invention, a ground voltage is applied to the source region 14 and drain region 16. A positive voltage such as +11 volts is supplied to alternate control gates 34. Thus, for example, as shown in FIG. 2, control gate 34B, 34D, 34F would have +11 volts applied thereto. For the other control gates such as control gate 34A, 34C, 34E etc., a negative voltage such as −20 volts or ground is applied thereto. The source 14 and the drain 16 are supplied with ground voltage. With these voltages applied, the floating gates 18A/C/E associated with the control gate 34A/C/E to which a negative voltage or ground has been applied would have its electrons stored thereon tunneled to the adjacent control gate 34B/D/F to which a positive voltage has been applied. Thus, for example, floating gates 18A, 18C and 18E would be erased. The electrons stored in those gates would tunnel to the adjacent control gates 34B, 34D, and 34F to which a positive voltage of +11 volts has been applied. The tunneling action of the electrons stored in the floating gates 18A/C/E etc., is caused in part by the positive potential of the adjacent control gate 34B/D/F as well as by the negative voltage applied to the associated second portion 38A/C/E of the control gate 34A/C/E, which repels the electrons stored on the floating gate 18A/C/E to cause them to be further accelerated through the insulator separating the floating gate 18A/C/E onto the control gate 34B/D/F. This results in the erasing of alternate floating gates in a first pass.

In a second pass, the voltages applied would be reversed. In that event, 0 or −20 volts would be applied to the control gate 34B/D/F etc., and a positive voltage of, for example, +11 volts is applied to the other control gates of 34A/C/E. This would cause the floating gates 18B/D/F etc., to be erased.

To further enhance the erase and to minimize reverse tunneling disturbance, sharp tips 42 can be formed on the floating gate 18, such as that shown in FIG. 4 to enhance the tunneling of the electrons from the floating gate 18 to the adjacent control gate 34. In addition, the provision of the tab portion 39 in the embodiment shown in FIG. 3 also enhances the erase operation and minimizes reverse tunneling. Of course, one can use both the sharp tip 42 as well as the tab 39 to further minimize the reverse tunneling disturbance.

In another method of the present invention, to further minimize the reverse tunneling disturbance, the NAND flash memory structure 30/130/230 of the present invention may be erased in more than two passes. Thus, for example, ground voltage is applied to the source region 14 and the drain region 16. 0 volts may be applied to the control gate 34A/E/I, 0 volts applied to the control gates 34B/F/J, a negative voltage, such as −11 volts applied to the control gates 34C/G/K and a positive voltage such as +11 volts is applied to the control gate 34D/H/L. The sequence is then repeated for the other control gates. In the first pass erase operation, the floating gate 18C/G/K associated with control gate 34C/G/K would be erased by having its electrons tunnel to the control gates 34D/H/L, which has a positive high voltage applied thereto.

In a second pass, the voltages applied to the control gates would then be shifted. Thus, for example, 0 volts would be applied to control gate 34A/E/I while a negative voltage, such as −11 volts is applied control gates 34B/F/J and a positive voltage such as +11 volts is applied to control gates 34C/G/K, and 0 volts is also applied to control gates 34D/H/L. Upon application of these voltages, the floating gate 18B/F/J would be erased. This scheme continues until four passes have occurred and all of the floating gates of a NAND structure 30/130/230 are erased.

Although in this method, disturb potential is less than that of a two pass erase, the disadvantage is that a greater number of passes must be made to erase the entire NAND structure 30/130/230.

Erase Option No. 2

In this method of erasing a NAND structure 30/130/230, the source 14 and the drain 16 are held at ground while all of the control gates 34 are supplied with substantially the same high positive voltage of +11 volts. In that event, the floating gate 18 would then be attracted to the positive voltage on the associated control gate 34, due to the capacitive coupling between the second portion 38 of the associated control gate 34 and the floating gate 18 such that electrons would tunnel from the floating gate 18 to the control gate 34. To further increase the erase efficiency, a sharp tip 42 can be placed on the side of the floating gate 18 immediately adjacent to the control gate 34 to which the control gate 34 has a second portion 38 which is capacitively coupled to the floating gate 18. This erase option has the advantage in that all of the floating gates 18 of the NAND structure 30/13/230 can be erased in a single pass.

Erase Option No. 3

In this third erase option, the semiconductor substrate 12 is held at a high positive voltage such as +12 volts. The source region 14 and the drain region 16 can be left floating. Each of the control gates of the NAND structure 30/130/230 is applied with a negative voltage such as −20 volts or is held at ground. The positive voltage of the substrate 12 along with the repulsive voltage from the second portion 38 of the control gate 34, causes the electrons in each of the floating gates 18 to tunnel through the insulating layer between the floating gate 18 and the substrate 12. The electrons would then be injected onto the substrate 12 from the floating gate 18.

Programming

The floating gates 18 in a NAND structure 30/130/230 are programmed in a particular direction either from the drain 16 to the source 14 or from the source 14 to the drain 16, depending upon the chosen array organization and the voltage applied. As an example, referring to FIG. 2, let us assume that the source region 14 is supplied with 0 volts and the drain 16 is applied with a positive 4.5 volts. All of the floating gates 18 are assumed to be first erased. Programming would then begin with the floating gate 18A followed by the floating gate 18B and proceeding all the way to the floating gate 18N. The control gate 34 associated with all of the erased floating gates 18 are supplied with +7 volts, except for the control gate 34K which is immediately adjacent to the floating gate 18J which is to be programmed. Therefore, if the floating gate 18A is to be programmed, the control gate 34B is applied with 1.5 volts whereas all of the other control gates 34C . . . 34N are supplied with 7 volts. The control gate 34A associated with the floating gate 18A which is to be programmed is also supplied with a +7 volts. In that event, the +7 volts on the control gates 34 of the erased floating gates is sufficient to turn on the portion of the channel region 32 over which the control gate 34 is positioned. In addition, due to the second portion 38 of the control gate 34 being capacitively coupled to the floating gate 18, it turns on the channel region over which the floating gate 18 is positioned. Therefore, the portion of the channel region beneath all of the control gates 34C . . . 34N as well as beneath the floating gate 18C . . . 18N are turned on. The select gate 40 is supplied with 7 volts to turn on that portion of the channel region. The application of +1.5 volts to the control gate 34B is also sufficient to turn on, albeit weakly, the portion of the channel region over which the control gate 34B is positioned. In addition, the application of +1.5 volts over the erased floating gate 18B is also sufficient to weakly turn on the floating gate 18B. The application of +7 volts to the control gate 34A turns on strongly the portion of the channel region over which the first portion 36A is positioned. In addition, the second portion 38A strongly turns on the floating gate 18A. At the juncture of the floating gate 18A and the control gate 34B, electrons from the source region 14 would experience an abrupt change in voltage and would be injected onto the floating gate 18A. This is the mechanism for source side, hot channel electron injection which programs the floating gate 18A.

Once the floating gate 18A is programmed, the next floating gate in sequence to be programmed would be floating gate 18B. The application of the voltages would be +7 volts to the control gates 34A and 34B as well as control gates 34D . . . 34N. +7 volts would be applied to the select gate 40. A voltage of +1.5 volts is applied to the control gate 34C, which is immediately adjacent to the floating gate 18B which is to be programmed. Thereafter, the mechanism of hot electron injection or source side injection would occur for the floating gate 18B, all as described previously.

To minimize the potential problem of program disturbance, the voltage is applied to the control gate 34 having associated erased floating gate can be lowered from +7 volts. In addition, to lower the program disturbance on cells adjacent to the floating gate 18 desired to be programmed, and sharing the same control gate, a bias voltage can be applied to the source junction 14 which shuts off the channel region under the selected control gate 34.

Read Operation

To read a selected cell, e.g. the floating gate 18B, the following voltages are applied. Control gates to one side of the selected cell such as control gate 34A is supplied with +5 volts. Control gates to the other side of the selected cell, such as control gates 34C . . . 34N as well as the select gate 40 are supplied with +5 volts. A +1.5 volt is applied to the control gate of the selected cell which in this case is control gate 34B. A ground voltage is supplied to the source region 14 and a read voltage of +1 volt is applied to the drain region 16. In the event the floating gate 18B is programmed, the application of the +1.5 volts to the control gate 34B is not sufficient to overcome the electrons stored on the floating gate 18B and the portion of the channel beneath the floating gate 18B would remain substantially shut off. In that event, the current in the channel region between the source 14 and the drain 16 would be weak. On the other hand, if the floating gate 18B were erased, the application of the +1.5 volts to the control gate 34B with the second portion 38B capacitively coupled to the floating gate 18B would be sufficient to turn on the channel region over the floating gate 18B. In that event, the current flow between the source 14 and the drain 16 would be larger and would be detected at the drain or bit line 16.

As can be seen from the foregoing, a high density NAND flash structure comprising of split gate memory cells with only 1 line per cell pitch is disclosed.

What is claimed is:

1. A method of erasing a plurality of flash memory cells in a flash memory structure formed in a semiconductor substrate of a first conductivity type wherein said structure has a first region of a second conductivity type in said substrate; a second region of a second conductivity type in said substrate, spaced apart from said first region, thereby defining a continuous channel region therebetween; a plurality of floating gates, spaced apart from one another, each positioned over a separate portion of the channel region, wherein each floating gate defines a flash memory cell; a plurality of control gates, each associated with and adjacent to one of the floating gates, each control gate having two portions directly and electrically connected to one another: a first portion over a portion of the channel region and not over any of the floating gates, and a second portion over the floating gate associated therewith and capacitively coupled thereto; wherein said method comprising:

applying a positive voltage to each of said control gates to provide capacitive coupling to the floating gates associated therewith; thereby causing tunneling of electrons from each floating gate to the control gate associated therewith.

2. The method of claim 1 wherein said first and second regions are at ground.

* * * * *